United States Patent [19]

Ruby

[11] Patent Number: 4,959,594
[45] Date of Patent: Sep. 25, 1990

[54] POWER SAVING ELECTROMAGNETIC DEFLECTION DISPLAY SYSTEM FOR DUAL MODE DEFLECTION AMPLIFIER

[75] Inventor: Joseph H. Ruby, Glendale, Ariz.

[73] Assignee: Honeywell Inc., Minneapolis, Minn.

[21] Appl. No.: 430,216

[22] Filed: Nov. 1, 1989

[51] Int. Cl.$^5$ ............................ H01J 29/70; H01J 29/76
[52] U.S. Cl. ...................................... 315/397; 315/406
[58] Field of Search ................. 315/397, 403, 365, 406

[56] References Cited

U.S. PATENT DOCUMENTS 4,678,970  7/1987  Goldman ............................ 315/397

Primary Examiner—Gregory C. Issing
Attorney, Agent, or Firm—Arnold L. Albin

[57] ABSTRACT

An electromagnetic deflection display system is operative for bi-directional raster and stroke deflection and provides minimum power dissipation in raster mode during a segmented or patch raster display. Energy stored in the deflection yoke during one direction of the raster scan is returned to an energizing power supply during the subsequent return scan in a manner that conserves power while avoiding an over-voltage condition of the associated power supply. A transformer is coupled to receive a portion of the energy stored in the yoke and return it to a designated raster mode power supply. The raster mode return voltage may be determined independently of stroke mode power requirements so as to optimize raster power savings and amplifier raster performance independent of the optimum stroke voltages.

9 Claims, 5 Drawing Sheets

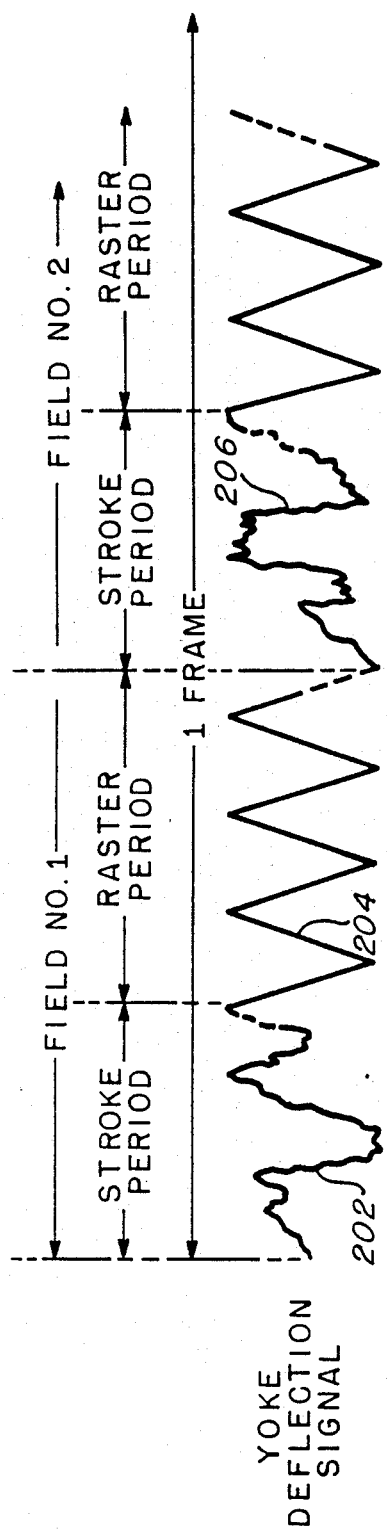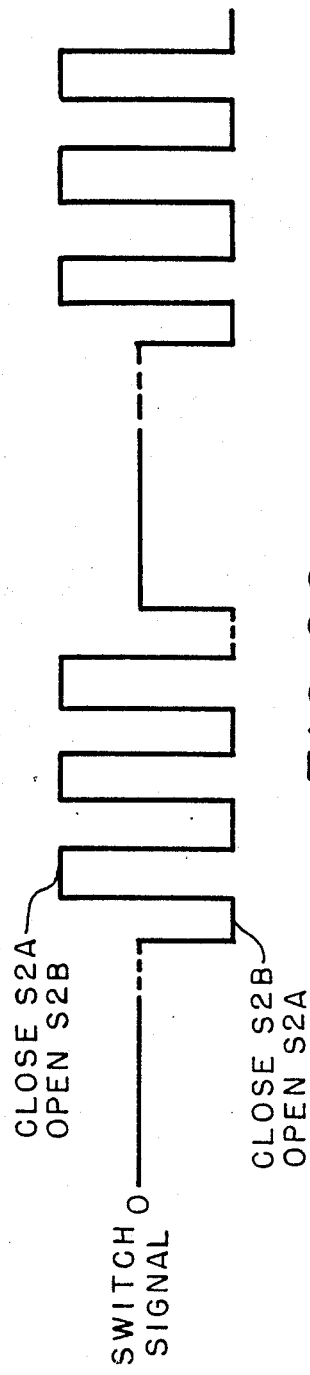

POWER SAVING ELECTROMAGNETIC DEFLECTION DISPLAY SYSTEM FOR DUAL MODE DEFLECTION AMPLIFIER

BACKGROUND OF THE INVENTION

1. Field of the Invention

The invention relates generally to display systems with electromagnetically deflected cathode ray tube random stroke and periodic raster displays, and more particularly to a system of the type described having a bi-directional raster scan with reduced power consumption when operating in a patch raster mode.

2. Description of the Prior Art

A primary concern in electromagnetically deflected cathode ray tube display systems is the significant increase in power consumption with larger, faster and brighter displays. The power efficiency of deflection systems that display both raster and stroke writing is relatively low due to the high yoke driving voltages required to assure adequate writing speed and linear operation to supply accurately controlled currents to the deflection yokes.

An additional area of concern is the slew rate of the deflection amplifiers. The slew rate design criteria (which also determine peak power requirements) are determined by the display content and format requirements. By utilizing a bi-directional raster which writes alternate lines of raster in opposite directions, the power required for fly-back is substantially reduced and additional information may be displayed during the retrace period without increasing the supply of voltages.

In U.S. Pat. No. 4,678,970 filed May 1, 1986 by Winston W. Goldman for *Power as Required Beam Deflection System for CRT Displays with Raster Supply Switching*, which patent is assigned to the assignee of the present invention, a system was described for reducing power during the raster display as well as during the stroke display. The invention provided for switching the power supplied to the yoke driver during the raster deflection period to the minimum power level required by the deflection wave form, as well as switching supply levels between the raster and stroke deflection periods. An accurate magnetic deflection system requires linear power amplifiers with feedback loops to provide position accuracy and long-term stability. Because the amplifiers operate in the linear mode, they dissipate large amounts of power. While power switching of the amplifier power supplies was provided by the aforementioned patent, it did not provide for patch raster capability. Patch raster allows the deflection drive to produce a visible raster segment anywhere on the CRT display screen without requiring scanning through the screen center. This asymmetrical scan saves raster scanning time by allowing the deflection system to scan only the area of interest. The prior art power switching systems are not capable of this patch raster operation and dissipate significantly great amounts of power. U.S. Pat. No. 4,678,970 used a power switching system that returned excess energy to the stroke power supplies. If patch raster was attempted, it was found that the added energy would cause an over-voltage condition in the stroke power supplies, resulting in damage to the deflection amplifier or the power supply itself. It is therefore desirable to provide an electromagnetic display deflection system which allows patch raster operation without adversely affecting the power supplies or deflection amplifier and which reduces energy consumption.

The present invention differs from the prior art by returning energy to the same supply from which energy was drawn during the previous raster scan line. The system returns energy at the raster scan line rate to the more heavily loaded of the raster supplies. This technique requires smaller decoupling capacitors and causes no power supply malfunction while allowing patch raster operation. Further, it results in saving a significant amount of power that would otherwise be dissipated in the deflection amplifier power stage.

SUMMARY OF THE INVENTION

The invention comprises an electromagnetic deflection display system of the type including means for providing deflection signals, deflection amplifier means, deflection display means, and power supply means. The display system is of the type providing bi-directional raster mode output power during a bi-directional raster mode of operation and stroke mode output power during a stroke mode of operation for powering the deflection display means. The deflection display means comprises means for providing raster mode output power during a first predetermined raster scan interval, energy storage means operative in a second predetermined raster scan interval for receiving at least a portion of the bi-directional raster mode output power provided during the first predetermined raster scan interval, first switching means coupled to the deflection display means and the energy storage means for directing the portion of output power to the energy storage means during the second predetermined raster scan interval, wherein the first and second raster scan intervals correspond to opposing directions of deflection by the deflection display means, and second switching means connected to the power supply means and the energy storage means for selectively returning the directed portion of bi-directional raster mode output power to a predetermined one of the power supply means during the second predetermined raster scan interval. In a preferred embodiment the energy storage means is comprised of a transformer having a first winding coupled to the first switching means and to the deflection amplifier means and a second winding coupled to the second switching means and to first and second raster mode power supplies, the first and second windings having a predetermined turns ratio such that a predetermined portion of energy is returned to a given one of the raster mode power supply means, said returned energy having a lesser value of energy than the given one raster mode power supply means has applied to the deflection display means, and wherein the stored energy provides a raster mode operating voltage independent of the stroke power supply means, which is selected for optimum raster performance while minimizing system power consumption.

BRIEF DESCRIPTION OF THE DRAWINGS

FIGS. 6a–6c are graphical representations of control signals and deflection signals during the stroke and raster scan periods of the present invention.

DESCRIPTION OF THE PREFERRED EMBODIMENT

Figure 1:
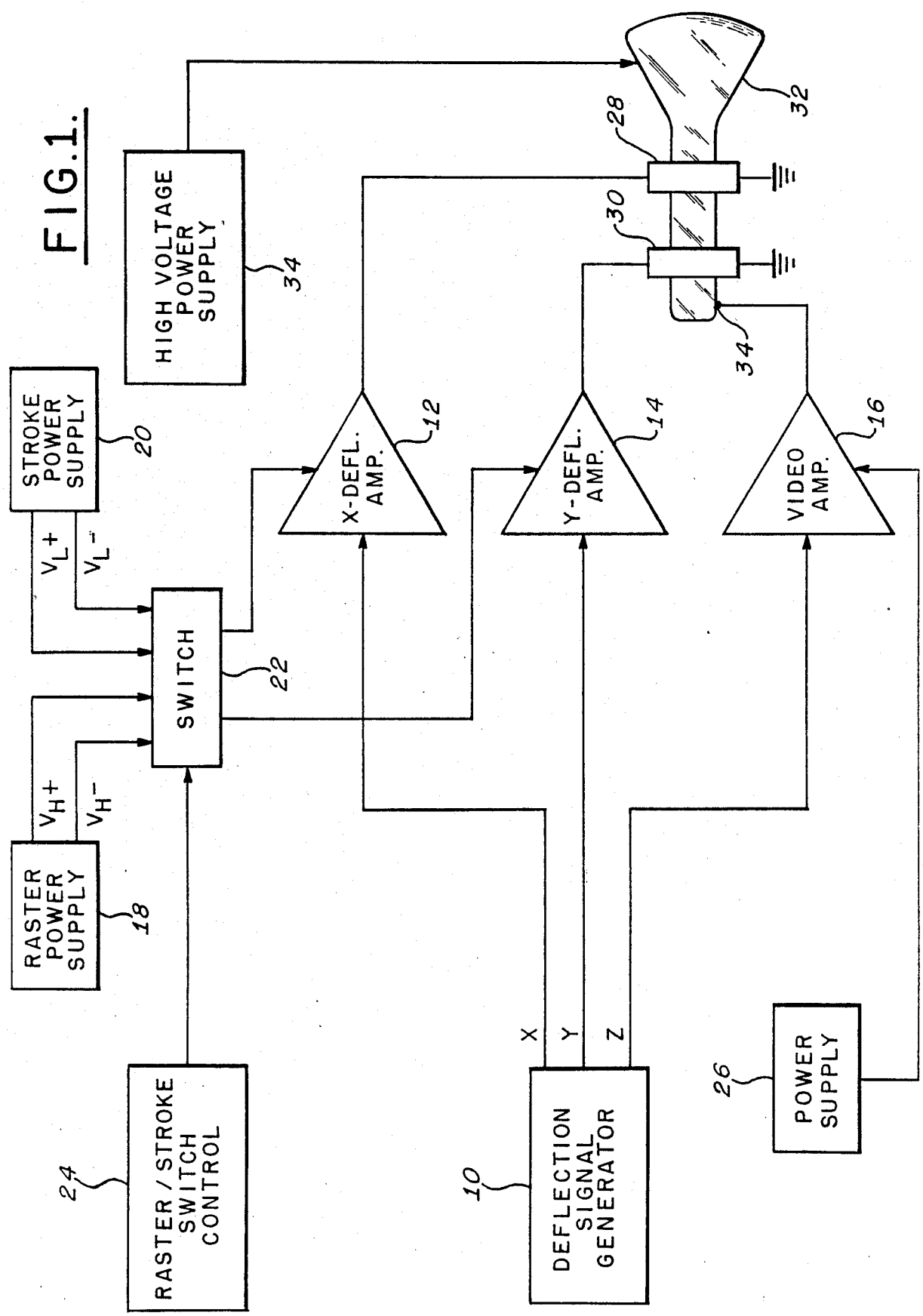
FIG. 1 is a block diagram of an electromagnetic deflection display system according to the invention.

With reference to FIG. 1, a deflection signal generator 10 provides X and Y cathode ray tube (CRT) deflection signals and a Z video signal which may incorporate means for brightening and blanking the CRT. Such deflection signal generators are well known in the art and need not be further described in detail herein. For purposes of the present invention the X, Y and Z signals from deflection signal generator 10 are applied to the appropriate circuits of a CRT 32 for providing background shading and symbology on the face of the CRT in response to signals from an external source and which symbology may be used to create a display for flight control purposes, as in a Flight Director Instrument.

Signal X from deflection signal generator 10 is applied to an X deflection amplifier 12 and signal Y from the deflection signal generator is applied to a similar Y deflection amplifier 14. The deflection amplifiers 12 and 14 are of the type which will be hereinafter described with reference to FIG. 2. The deflection amplifiers are powered by a raster power supply 18 providing voltages $+V_H$ and $-V_H$ and a similar stroke power supply 20 providing voltages $+V_L$ and $-V_L$. Power supplies 18 and 20 are of the type which will be hereinafter described with reference FIGS. 2 and 3.

The Z signal from deflection signal generator 10 is applied to a conventional video amplifier 16. Amplifier 16 is powered by a conventional power supply 26.

Deflection amplifier 12 is connected to an X-axis deflection yoke 28 of CRT 32 and Y deflection amplifier 14 is connected to a Y-axis deflection yoke 30 of the CRT. Video amplifier 16 is connected to an appropriate brightness electrode 34 of CRT 32. CRT 32 is powered by a conventional high voltage power supply 34.

Operational modes of the X deflection amplifier 12 and Y deflection amplifier 14 are controlled by switch 22 which applies predetermined voltages from power supplies 18 and 20 in accordance with the sequentially alternating random stroke and bi-directional raster scan modes. Switching intervals are controlled by raster/-stroke switch control 24 which may be comprised of conventional logic switching elements. It will now be understood that the electromagnetic deflection system shown in FIG. 1 is effective for both random stroke writing and bi-directional raster displays. Amplifiers 12 and 14 are dual-mode deflection amplifiers having independent linear and slew characteristics, whereby the raster scan time may be significantly reduced as compared to a non-dual arrangement and provide an effective reduction in power consumption in a manner to be described. The switching of power supplies 18 and 20 to a prescribed value required for the data to be displayed significantly reduces the size and weight of the system over one wherein the maximum supply voltage is applied at all times.

Figure 2:
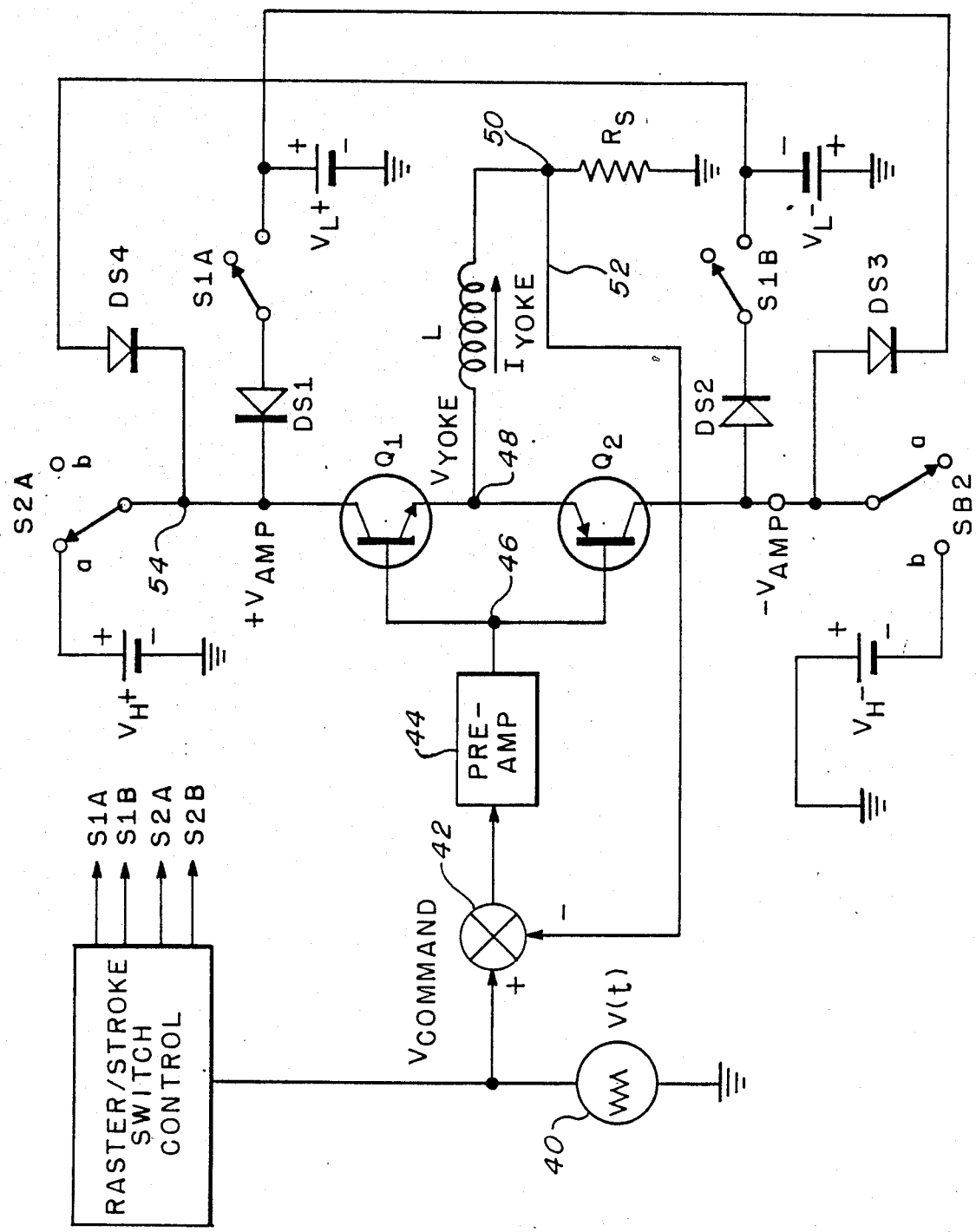
FIG. 2 is an electrical schematic diagram of a prior art dual mode switching deflection amplifier shown generally in FIG. 1.

It is helpful to understand the operation of the prior art display system before considering the present invention. Referring now to FIG. 2, there is shown an electrical schematic diagram of a prior art electromagnetic display deflection system in accordance with the block diagram of FIG. 1. Amplifiers 12 and 14 of FIG. 1 will now be described. The amplifier includes a preamplifier stage 44 and an output or emitter-follower stage comprised of cascaded transisters $Q_1$ and $Q_2$ and switches S1A, S1B, S2A, and S2B. Junction 48 is connected in common to the emitters of transistors $Q_1$ and $Q_2$ and is connected to a deflection yoke L. Yoke L is further connected at node 50 to a small value resistance $R_s$, which may be of the order of 1 ohm. The junction of yoke L and resistor $R_s$ is further connected via lead 52 in a feedback manner to summing junction 42. Summing junction 42 receives a deflection command signal 40 where it is combined with the signal on lead 52 in a subtractive manner and applied to preamplifier 44. The raster power supplies $+V_H$ and $-V_H$ are coupled through associated switches S2A and S2B, to the collectors of transistors $Q_1$ and $Q_2$, respectively. The stroke voltage power supplies $+V_L$ and $-V_L$ are coupled through associated steering diodes DS1 and DS2 to the collectors of transistor $Q_1$ and $Q_2$, respectively. The voltage developed at the collector of transistor $Q_1$ is denoted as $+V_{amp}$ while the voltage developed at the collector of transistor $Q_2$ is denoted at $-V_{amp}$. The positive stroke voltage supply $+V_L$ is also coupled through a diode DS3 to node 56 which connects to the switch arm of switch S2B and the collector of transistor $Q_2$. The negative stroke voltage power supply $-V_L$ couples through diode DS4 to node 54 which is connected to the collector of transistor $Q_1$ and the switch arm of switch S2A. Switches S1A and S1B are closed during the stroke mode thereby applying the corresponding stroke voltages to transistors $Q_1$ and $Q_2$ while switches S2A and S2B are open. During the raster mode switches S1A and S1B are open while switches S2A and S2B alternately transfer power from the $V_H$ and $V_L$ supplies to transistor $Q_1$ and $Q_2$.

Figure 3A:
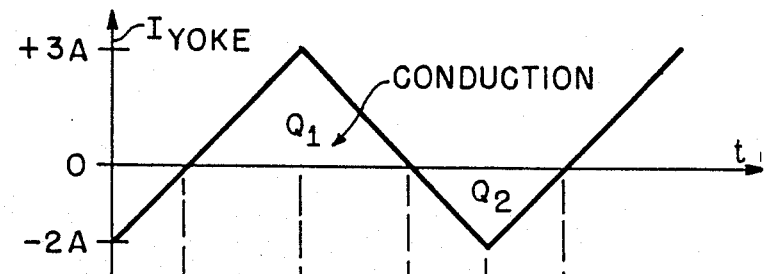
FIGS. 3a–3b are graphical representations showing waveforms at various points of the deflection amplifier shown schematically in FIG. 2 while operative in the stroke deflection mode.
Figure 3B:
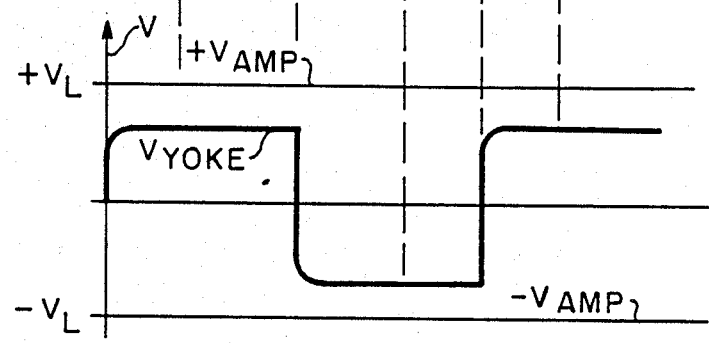

In operation, in stroke mode switches S1A and S1B are closed and switches S2A and S2B are initially in the b position (open circuit). Referring now to FIG. 3a, which shows a graphical representation of deflection amplifier waveforms in the stroke mode, with continued reference to FIG. 2, when the yoke current $I_{yoke}$ is positive it flows from stroke mode power supply $+V_L$ through switch S1A, diode DS1, transistor $Q_1$, the yoke L, and through series resistance $R_s$ to ground. The rate of change of this current is controlled by the voltage $V_{yoke}$ developed at node 48 which is supplied by the amplifier 44 and $Q_1$, $Q_2$ via the signal developed through the closed loop formed by lead 52. The desired yoke current waveform is generated by the applied signal V(t) at source 40 and is compared to the voltage sensed from the current sample resistor $R_s$. The voltage developed across resistor $R_s$ is proportional to the current $I_{yoke}$. The error between the applied signal V(t) and the voltage drop at node 50 is amplified to drive the output power stage $Q_1$, $Q_2$. Thus, signal $V_{yoke}$ at node 48 is driven to the proper voltage to produce the required yoke current. The CRT beam position then is proportional to this deflection yoke current.

Whenever the yoke current is flowing in a positive direction, denoted by the arrow in FIG. 2, current must flow through transistor $Q_1$ and when the yoke current is negative, the current must flow through transistor $Q_2$.

In FIG. 3a, the positive yoke current region is shown by the triangle $Q_1$ and the negative current region by triangle $Q_2$. As can be seen from FIG. 2, positive yoke current, corresponding to the upper half of the CRT display for the Y-axis deflection amplifier, is supplied by the $+V_L$ power supply. In this case, except for a small voltage drop through diode DS1, the voltage $V_{amp}$ at the collector of transistor $Q_1$ is equal to the applied voltage $+V_L$. The corresponding yoke voltage $V_{yoke}$ results from the collector to emitter voltage drop of transistor $Q_1$. In the example of FIG. 3a, the beam is offset towards the upper half of the CRT screen since the current ramps between $-2A$ to $+3A$ and thus transistor $Q_1$ conducts for a longer interval than transistor $Q_2$ and power supply $+V_L$ supplies more energy than power supply $-V_L$. It is further seen from FIG. 3a and FIG. 3b that so long as the yoke current is positive, even though the yoke current has a negative slope, it must be energized by the $+V_L$ power supply. Correspondingly, when the yoke current is negative, the energy is supplied by the $-V_L$ power supply.

Figure 5A:
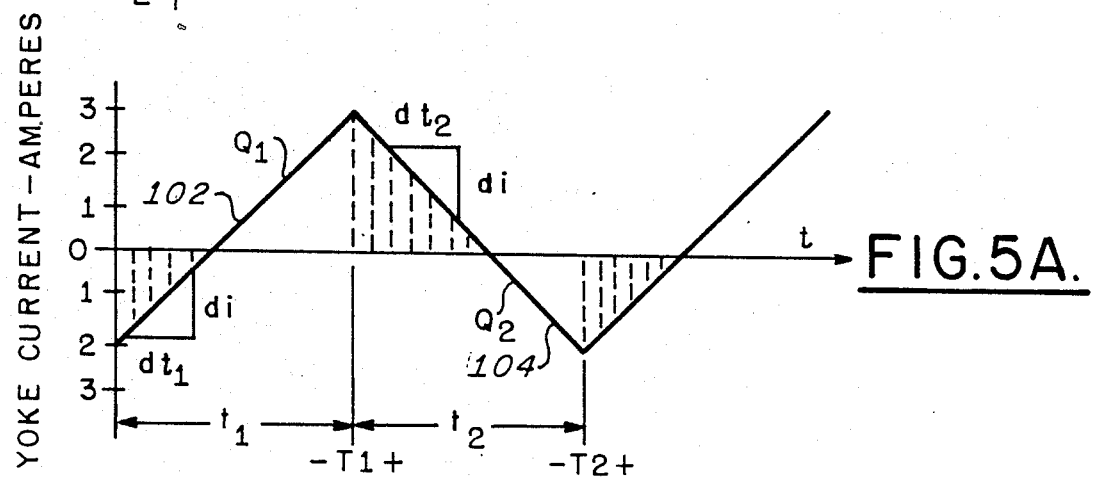
FIGS. 5a–5b are graphical representations showing waveforms at various points of the deflection amplifier shown in the schematic of FIG. 4 while operative in the bi-directional raster mode.

After the stroke interval is completed, which may typically be of the order of $6.25_{msec}$, the display is switched to raster mode. Assuming, in this example, that raster shading is desired to be located in the same region as the stroke information, the same yoke current drive levels will be required as were required for the stroke display. Thus, FIG. 5a shows a yoke current wave form similar to that of FIG. 4a except that the time scale will differ. While the ratio between the stroke interval and raster interval is a function of the information to be displayed in each mode, a 50% duty cycle may be illustrative. In operation, the raster/stroke modes will be scanned at 60-80 Hz in order to assure that no flicker is visible to the human eye.

From FIG. 2, whenever the raster yoke current is increasing (positive slope) raster power switch S2A is in position a (closed) while raster power switch S2B is in position a (open). Whenever the raster yoke current is decreasing (negative slope) raster power switch S2A is in position b (open) and raster power switch S2B is in position b (closed). During raster scanning, stroke switches S1A and S1B are open, while the switches are closed during the stroke mode.

Referring now to FIG. 5a, at time $-T1$, corresponding to a yoke current $I_{yoke}$ of 3A, transistor $Q_1$ is conducting 3 amp. The current path is from the $+V_H$ supply through switch S2A, transistor $Q_1$, yoke L, resistor $R_s$ into ground. Thus, power supply $+V_H$ is delivering the energy to the yoke. At time $+T1$, wherein the raster sweep is retracting its path, switches S2A and S2B transfer to the b position. Transistor $Q_1$ is still carrying current at 3 amp. However, the stored energy is now returned to the $-V_L$ supply through diode DS4, $Q_1$, yoke L, resistor $R_s$ and ground.

During the stroke period, since the pattern was shifted towards the top of the CRT screen, transistor $Q_1$ conducted for a longer duration than transistor $Q_2$. Thus the stroke pattern withdrew more energy from the $+V_L$ supply than the $-V_L$ power supply. During the raster scan interval, it may be seen that more raster energy is returned to the $-V_L$ power supply than to the $+V_L$ power supply. When the pattern crosses the screen center (zero current), all of the stroke energy will be drawn from the $+V_L$ supply and none will be drawn from the $-V_L$ power supply. However, all of the raster return energy is returned to the unloaded $-V_L$ power supply. Since the power supply will be incapable of regulating under these conditions, there results an overvoltage condition and malfunction of the power supply. Further, very large decoupling capacitors are required to maintain reasonable power supply ripple at an 80 Hz raster to stroke scan cycle.

Figure 4:
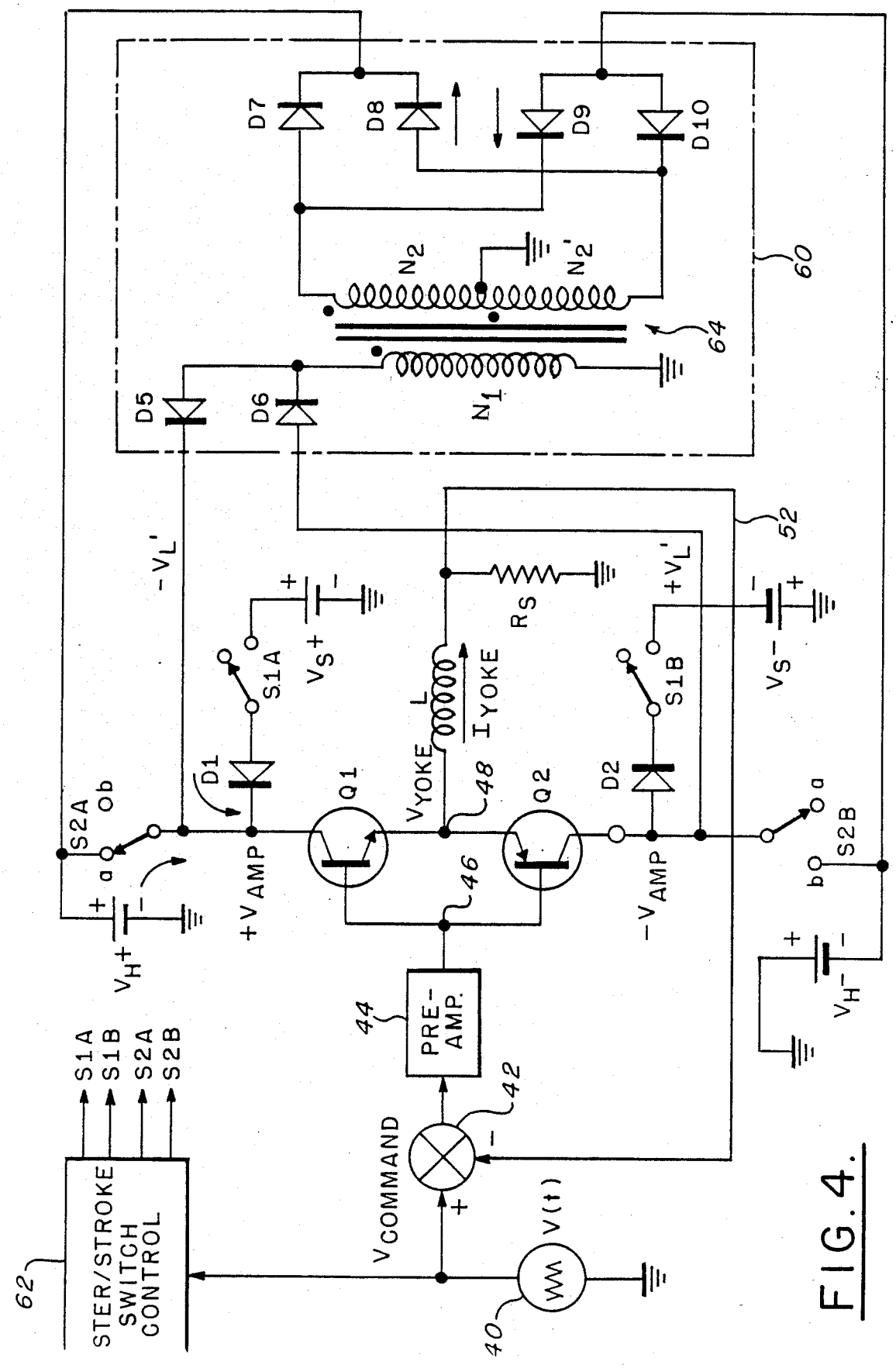
FIG. 4 is an electrical schematic diagram of a patch raster deflection amplifier according to the present invention.

FIG. 4 shows in substantial detail a schematic diagram of an amplifier according to the present invention and as shown generally in FIG. 1. Components with like reference numerals function in a manner as described with respect to FIG. 2.

The preamplifier 44 is coupled to cascaded output transistors $Q_1$ and $Q_2$, yoke L, and resistor $R_s$ as previously described. Similarly, feedback is applied from resistor $R_s$ along lead 52 to a summing junction 42, which also receives a command signal V(t) from signal source 40. During the stroke mode, switches S1A and S1B are closed and switches S2A and S2B are open and energy is provided by power supplies $+V_s$ through diode D1 to transistor $Q_1$ and from power supply $-V_s$ through diode D2 to transistor $Q_2$. In the raster mode, switches S1A and S1B are open, and power is provided by the $+V_H$ supply through switch S2A to transistor $Q_1$ and from power supply $-V_H$ through switch S2B to transistor $Q_2$.

Additional energy is stored in and returned from circuit 60 which includes a transformer 64 having a primary winding $N_1$ and a center-tapped secondary winding having equal portions $N_2$ and $N_{2'}$. Winding $N_1$ is terminated to ground at one end and connects to the anode of a diode D5 and the cathode of a diode D6. The cathode of diode D5 is connected to a switch arm of switch S2A and the collector of transistor $Q_1$. The anode of diode of D6 is connected to the switch arm of switch S2B and the collector of transistor $Q_2$. The center tap of the secondary of the transformer 64 is connected to ground. A bridge rectifier comprised of diodes D7-D10 has an input connected across the secondary $N_2$, $N_{2'}$. The cathodes of diodes D7 and D8 are coupled together and provide an output to terminal a of switch S2A and to the $+V_H$ power supply. The anodes of diodes D9 and D10 are coupled together and to the b terminal of switch S2B and to the $-V_H$ power supply.

In operation, the deflection yoke is powered according to the present invention by a circuit as schematically illustrated in FIG. 4. The stroke voltage supplies are applied as in the prior art through switches S1A and S1B. During the stroke mode switches S1A and S1B are closed and switches S2A and S2B are in the open position. In the raster mode, switches S1A and S1B are in the open position, and switches S2A and S2B are sequentially and alternately opened and closed. Thus, whenever a raster scan line changes direction, switches S2A and S2B change state from a to b or b to a. As shown in FIG. 5a, which illustrates exemplary waveforms in the raster mode, current passing through transistor amplifier $Q_1$ is indicated as having a positive value (above the time axis) and current passing through transistor $Q_2$ is indicated as having a negative value (below the time axis). Assuming the current is increasing during period $t_1$ as on line 102, and that the current is flowing through transistor $Q_1$, switch S2A will be in the closed position and switch S2B will be in the open position. The current path is from raster mode power supply $+V_H$ through switch S2A, transistor $Q_1$, yoke L, resistor $R_s$, and ground.

As the scan gets to the top of the desired raster area, the yoke current will be about 3.0 amperes and switches S2A and S2B will change state from a to b. At this point the command signal V(t) will reverse the voltage applied to yoke L. This will cause the current in yoke L to diminish. As the raster scans downward from the top of the screen the yoke current reduces from 3.0 to 2.5 amp. This yoke current is flowing in the same direction and therefore continues to flow through transistor $Q_1$. Since the current in the inductance cannot instantaneously change direction, transistor $Q_1$ will continue to conduct until the current reaches zero. However, now the current path will be through transistor $Q_1$, inductor L, resistor $R_s$, the primary $N_1$ of the transformer 64, and diode D5, thus energizing the primary of the transformer 64 which is caused to store energy in the transformer core and air gap. The current flowing through the primary induces a current flow through the secondary windings $N_2$ and $N_{2'}$ which is coupled through diode D8 to the $+V_H$ power supply and through diode D9 to the $-V_H$ power supply. Thus, the stored energy is returned to the corresponding raster mode power supplies. Because the deflection system is scanning a patch at the top of the CRT screen ($+3.0$ to 2.5 amp), the $+V_H$ power supply is supplying all of the raster energy. As soon as a small amount of energy is returned to the $-V_H$ power supply via diode D9, the supply output voltage will rise by one diode drop (0.7 volt typically). At this voltage level, diode D9 will be biased to nonconducting and all return power therefore will be diverted through diode D8 to the heavily loaded $+V_H$ power supply. Thus, the voltage output of the $-V_H$ power supply will be limited to acceptable bounds. Further, for any desired display pattern, the deflection system will always draw more raster power from each raster mode power supply than is returned to each of the raster supplies, thus the raster supplies cannot achieve an overvoltage condition. This power return will take place for each raster scan line at a rate of 33 usec instead of at the raster/stroke interval of 6250 usec. Thus the required power supply filter capacitors are very small. Transformer 64 is also compact because the pulse duration is of the order of 33 usec or less.

As the current through yoke L and transistor $Q_1$ diminishes to zero, current in transistor $Q_2$ will increase to drive reverse current through the yoke L. During this time switches S2A and S2B are in the b position. The current path is from the $-V_H$ power supply through transistor or $Q_2$, yoke L, resistor $R_s$, and ground. At time $-T_2$, the end of the raster time interval t2, the command voltage will cause a reversal in the applied voltage to the yoke. At the same time, switches S2A and S2B will return to the a positions. Thus, the current path will now be from the emitter or transistor $Q_2$ through yoke L, resistor $R_s$, ground, transformer winding $N_1$ and diode D6 to the collector of transistor $Q_2$. Since the current through winding $N_1$ is now energizing transformer 64 to drive diodes D7 and D10 into conduction, diode D7 will allow the voltage at the $+V_H$ supply to rise by one diode drop and then be biased to nonconduction. This, all the energy stored in transformer 64 and yoke L will be returned through diode D10 to power supply $-V_H$, the supply from which the raster power was initially drawn on this portion of the scan. The shaded areas of FIG. 5a represent the regions in which stored energy is returned to the source power supply.

Note that transformer 64 will have its primary winding clamped at a predetermined value for raster energy return corresponding to the desired value for $+V_L'$ or $-V_L'$. This value is determined by the turns ratio $N_1:N_2$ and may be established independently of the stroke voltage supply $V_s$. Thus, a new design parameter is introduced that allows $V_L$ to be selected for optimum raster power savings and amplifier raster performance independent of the optimum stroke voltages.

Switches S1A, S1B, S2A, and S2B may be comprised of conventional semiconductor elements biased to operate in either of the saturated or cutoff modes as in said U.S. Pat. No. 4,678,970. Raster stroke switch control 62 may be comprised of conventional logic gates.

In raster mode the writing speeds required are typically several times greater than that required in stroke writing mode. This requires a greater rate of change of current to be developed through the yoke L and thus requires a higher voltage supply. Supply $V_H$ is typically of the order of 52 volts while the stroke supply $V_s$ is of the order of 22 volts.

It will be clear to one skilled in the art that by adjusting the turns ratio of transformer 64 the transformer may be designed to establish its primary voltage at the optimum value for raster energy return, $+V_L$ or $-V_L$. The transformer turns ratio may be selected to provide for optimum raster power savings and amplifier raster performance, independent of the optimum stroke voltages.

In one embodiment, the transformer was designed to provide voltages of plus or minus 18 V for $+V_L$ and $-V_L$. The transformer was comprised of a Magnetics Corporation ferrite pot core, part #F-43019-UG. The primary and secondary windings were comprised of seven wires in parallel to assure close coupling with a turns ratio 3:1. The primary was formed from 47 turns of #26 awg copper wire, resulting in a primary inductance of 1.0 mh. The secondaries were each comprised of three coils of 47 turn of #28 awg wire, series connected. Each section on the secondary had an inductance of 9.0 mh.

Figure 5B:
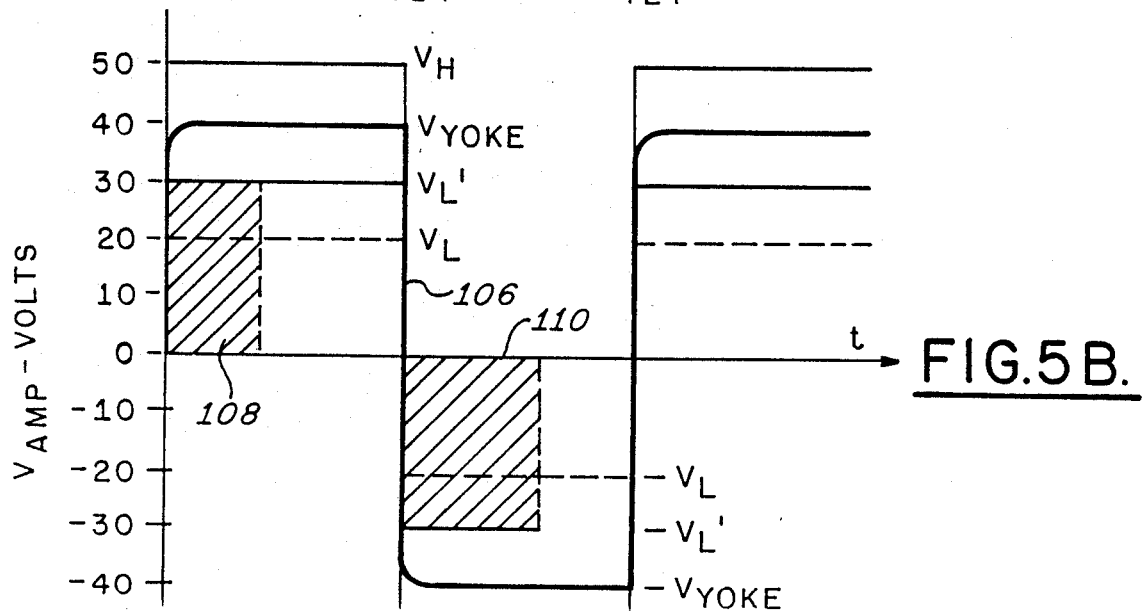

The energy conservation features of the present invention can perhaps better be understood through the drawing of FIGS. 5a and 5b which show the required yoke current to accomplish deflection of the electron beam across the CRT face and the application level of voltaes to the deflection coil from separate power supplies. By separation of these functional voltage supplies, savings in power can be achieved.

Thus, the curve ilusrated in FIG. 5a represents the desired output of the drive circuit, namely the yoke current occurring in the deflection yoke L of the CRT. In any given deflection system, the deflection of the electrom beam is caused by the electric field generated in the yoke. This field is effectively produced by the product of the yoke inductance and the current flowing through the yoke. The change in the magnetic field is accomplished by applying a given voltage to the deflection yoke according to the well-known equation:

$$V = L(di)/(dt)$$

In designing the deflection system, the constraints on deflection power are the inductance and current rating for the yoke of the CRT. The voltage to be placed on the coil then is determined by the relationship of the above equation, where V is the voltage necessary across the coil, L is the inductance in henries, and (di)/(dt) is the rate of change of current with respect to time.

Since the inductance L is fixed, the voltage placed upon the coil has to be determined in order to drive the current at the desired rate. FIG. 5a illustrates a typical current wave for a bi-directional raster. $t_1$ represents the trace time of the forward scan and $t_2$ represents the trace time of the reverse scan. It may be seen that the relationship $(di)/(dt)$ is of opposite polarity for the initial trace and the retrace, so that the requirement for the applied voltage is such that a negative voltage must be applied during time $t_2$. The volage supply must be made large enough to cause the trace to scan across the complete face of the CRT within a given time. In the present invention, the voltage supply is conditioned to have three discrete values, one active for the stroke time, and two active for the bi-directional raster. This approach minimizes the overall power requirement of the deflection system as will be described.

In FIG. 5a, line 102 indicates the value of current through the yoke coil, which is indicated on the ordinate axis as reaching a maximum value at time T1. After reaching this value and positioning the CRT beam at the desired position on the face of the CRT, the deflection coil current diminishes through the deflection time $t_2$ as further illustrated by line 104. Note that the slope of the current curve is now opposite to that of line 102. At such time at which the electron beam completes its deflection trace across the desired sector of the cathode ray tube, the raster scan is repeated.

In FIG. 5b the voltage applied to the yoke is generally indicated according to the solid line 106. Here a value of 40 volts is required to provide a predetermined deflection rate. Note that the required applied voltage is a function of the slope of curves 102 and 104 and not of the absolute value of current.

The power savings obtained by the present invention as compared with the prior art can be illustrated by reference to FIG. 5b. In the circuit illustrated by FIG. 2, it was noted that patch raster operation was not possible because of the overvoltage condition induced in the unloaded power supplies. However, it has been found that patch raster operation could be accomplished by disconnecting the anode of diode DS4 from the $-V_L$ power supply and connecting the anode to ground. Similarly, the cathode of diode DS3 was disconnected from power supply $+V_L$ and connected to ground. By this means, stored energy in the yoke was dissipated to ground rather than being returned to the unloaded power supplies. However, it was found that this caused a subtantial increase in the power dissipation of amplifiers $Q_1$ and $Q_2$, requiring extensive heat sinking and forced air cooling. Referring again to FIG. 5b, the power dissipation may be computed by taking the product of the collector to emitter voltage drop and the current through the power transistor. Thus, the peak current during conduction through $Q_1$ occurred at 3.0 amperes at time T1. At T1+ the Q1 collector voltage, $+V_{amp}$, is equal to the supply voltage $-V_L$, which has a nominal value of $-52 \times N1/N2 = -17v$. The Q1 emitter voltage, Vyoke, in this example was $-40$ volts. Therefore, the peak dissipation is $23v \times 3.0$ amp or 69 watts. For the case where diodes DS3 and DS4 are grounded, the collector voltage is zero, while the yoke voltage remains at $-40$ v. Therefore the peak power dissipation is 120 watts. Clearly, the present invention not only provides a patch raster capability but also a substantial improvement in power efficiency over the modified circuit of FIG. 2. The shaded area 108 represents the power dissipation which is avoided by the present invention. Similarly, during the retrace interval $t_2$ a like analysis shows a power saving as denoted by the shaded area 110. The shaded areas of FIG. 5a represent energy returned to the raster mode power supplies by virtue of the improved operation of the present invention.

For optimum raster performance while minimizing power consumption, the raster mode operating voltages $+V_L'$ and $-V_L'$ should be selected so that the difference between the raster mode operating voltage provided by the stored energy and the voltage developed across the yoke $V_{YOKE}$ is substantially equal to the voltage difference between the raster power supply voltage $+V_H$, $-V_H$ and the yoke voltage $V_{YOKE}$. Thus, in FIG. 5B, $V_H - V_{YOKE} = +10$ V.

Referring now to FIGS. 6a–6c, the switching modes of the present invention will be described. FIG. 6a shows a display frame which cnsists of two sequential and interlaced fields, field #1 and field #2, which preferably may be repeated at an 80 Hz rate, each field comprising a stroke period and a raster period. In practice, depending on the ratios of information to be presented during the stroke period and the raster period, this rate may range from 60 to 80 Hz. Each field is divided into a stroke period during which the deflection signal is aperiodic, as noted by waveform segment 202 and a raster period during which the deflection signal is repetitive, as noted by waveform 204. Typically the raster and stroke periods will have a duration of 6.25 ms, with a raster scan line rate of 33 usec. Following completion of the raster period in field #1, field #2 is executed. the sequential display of fields #1 and #2 constitutes a frame, which is then repeated. Waveform 206 denoting the stroke signal in field #2 may differ from wave form 202 in field #1 to the extent that the desired display symbology may change from field to field. Similarly, the amplitude of the raster scan may change and may be asymmetrical depending on how a patch raster is to be displayed. While the yoke deflection signal is periodic during the raster scan, it is aperiodic in nature during the stroke duration because of the random nature of the commanded deflection of the CRT beam.

FIG. 6b shows a raster/stroke signal utilized for activating switches S1A, S1B, S2A, and S2B. It may seen that the opening and closing of the respective switches is synchronized with the stroke and raster periods in each field in a manner which has been described above.

As shown in FIG. 6c during the raster period a periodic switch signal is applied to sequentially and alternately open and close switches S2A and S2B in accordance with the direction of the raster scan.

It will now be seen that the present invention provides an improved electromagnetic deflection display system for both random stroke writing and bi-directional raster displays in which dual mode deflection amplifiers and energy efficient power utilization contribute to decreased power consumption and system size and weight. The deflection amplifiers provide optimum designs for both stroke and raster with no significant increase in power consumption.

This system allows a true patch raster anywhere on the CRT screen while providing a substantial saving in power consumption. The operation is independent of the desired display pattern. Power supply switching at each change in direction of the raster scan reduces the need for large-sized power supply decoupling capacitors. The need for an additional power supply is eliminated by virtue of the internally derived raster power source whose parameters may be defined independent of stroke voltage requirements.

While the invention has been described in its preferred embodiments, it is to be understood that the words which have been used are words of description rather than of limitation and that changes within the purvue of the appended claims may be made without departing from the true scope and spirit of the invention in its broader aspects.

Embodiments of an invention in which an exclusive property or right is claimed are defined as follows:

1. In an electromagnetic deflection system for a CRT display of the type including means for providing deflection signals, deflection amplifier means, a deflection coil for causing movements of an electron beam across said CRT display, and a plurality of power supply means, said display system providing bi-directional raster mode output power during a bi-directional raster mode of operation and stroke mode output power during a stroke mode of operation for powering said deflection display means, said deflection amplifier means providing raster mode output power during first and second predetermined raster scan time intervals, and means for raster scanning at least a portion of said CRT display, said first and second raster scan intervals corresponding to opposing directions of deflection by said deflection display means, deflection display means comprising:

energy storage means operative in said second predetermined raster scan interval for receiving at least a portion of said raster mode output power provided during said first predetermined raster scan interval, first switching means coupled to said deflection coil and said energy storage means for directing said portion of output power to said energy storage means during said second predetermined raster scan interval, and second switching means connected to said plurality of power supply means and said energy storage means for selectively returning said directed portion of bi-directional raster mode output power to a predetermined one of said plurality of power supply means during said second predetermined raster scan interval.

2. An electromagnetic deflection display system as set forth in claim 1, said plurality of power supply means comprising stroke power supply means and raster power supply means and further comprising third switching means for selectively applying said stroke power supply means to said deflection amplifier means in said stroke mode and for selectively applying said raster power supply means of said energy storage means to said deflection amplifier means during said bi-directional raster mode, said stroke and raster modes of operation being independent of each other, said raster power supply means further comprising first and second raster mode power supply means for sequentially and alternately energizing said deflection display means, and said second switching means so adapted and constructed for returning said portion of bi-directional raster mode output power to a given one of said first or second raster mode power supply means wherefrom said deflection display means has been energized.

3. An electromagnetic deflection display system as set forth in claim 2 wherein said third switching means is coupled to said raster mode power supply means and said deflection amplifier means and initially operative during said bidirectional raster mode of operation for applying raster mode power to said deflection display means and responsive to a rate of change of raster scan deflection signals for switching to an energy storage and energy returned mode of operation to apply stored energy to said raster mode power supply means wherefrom said deflection display means has been energized.

4. An electromagnetic defection display system as set forth in claim 3, wherein said second switching means is operative only during said bi-directional raster mode for comparing an output voltage of said first or second raster mode power supplies and an output voltage developed by said energy storage means and for returning said stored energy to a given one of said first or second raster mode power supply means having the lesser value of output voltage, wherein said lesser value is indicative of the raster mode power supply which has energized said energy storage means during a predetermined portion of said bi-directional raster scan interval.

5. An electromagnetic defelction display system as set forth in claim 4, wherein said energy storage means is comprised of a transformer having a first winding coupled to said first switching means and to said deflection amplifier means and a second winding coupled to said second switching means and to said first and second raster mode power supplies, said first and second windings having a predetermined turns ratio such that said energy returned to said given one of said raster mode power supply means is a lesser value of energy than said given one has applied to said deflection display means, and said stored energy provides a raster mode operating voltage independent of said stroke power supply means, said operating voltage selected so that the difference between the voltage developed across said yoke by said deflection amplifier means and said first or second raster mode power supplies is substantially equal to the difference between said yoke voltage and said raster mode operating voltage, thereby returning energy to said raster mode power supplies for minimizing system power consumption.

6. An electromagnetic deflection display system as set forth in claim 5, wherein said first switching means is comprised of a first unidirectional conductive means coupled to said first winding and said second switching means is comprised of a second unidirectional conductive means coupled to said second winding.

7. An electromagnetic deflection display system as set forth in claim 6, wherein said first unidirectional conductive means is further comprised of a plurality of unidirectional elements, a first said element having an anode coupled to said deflection amplifier means and a cathode coupled to said first winding, a second said element having a cathode coupled to said deflection amplifier means and an anode coupled in common with said cathode of said first said element.

8. An electromagnetic deflection display system as set forth in claim 7, wherein said second winding of said transformer is further comprised of a pair of symmetrically disposed coupled windings, said second unidirectional conductive means being further comprised of a plurality of unidirectional conductive elements disposed in a bridge configuration across said pair of windings and having a first node coupled to said first raster mode power supply means and a second node coupled to said second raster mode power supply means.

9. An electromagnetic deflection display system as set forth in claim 8, wherein said secondary winding is center tapped.

* * * * *